United States Patent [19]
Hymes et al.

[11] Patent Number: 5,858,109
[45] Date of Patent: Jan. 12, 1999

[54] METHOD AND APPARATUS FOR CLEANING OF SEMICONDUCTOR SUBSTRATES USING STANDARD CLEAN 1 (SC1)

[75] Inventors: Diane J. Hymes, San Jose; Mikhail Ravkin, Sunnyvale; Wibur C. Krusell, Palo Alto; Venus Noorai, San Jose, all of Calif.

[73] Assignee: Ontrak Systems, Inc., San Jose, Calif.

[21] Appl. No.: 792,093

[22] Filed: Jan. 31, 1997

Related U.S. Application Data

[63] Continuation-in-part of Ser. No. 542,531, Oct. 13, 1995, abandoned.

[51] Int. Cl.$^6$ ....................................................... B08B 7/00
[52] U.S. Cl. .................................... 134/2; 134/6; 134/26; 134/29; 134/902; 15/77; 15/102
[58] Field of Search ................. 15/77, 21.1, 24, 15/102, 88.3; 134/2, 6, 9, 902, 26, 29, 32, 33, 1.3, 1

[56] References Cited

U.S. PATENT DOCUMENTS

| | | | |
|---|---|---|---|
| 4,569,695 | 2/1986 | Yamashita et al. | 134/9 |
| 5,518,552 | 5/1996 | Tanoue et al. | 134/6 |
| 5,581,837 | 12/1996 | Uchiyama et al. | 15/77 |
| 5,639,311 | 6/1997 | Holley et al. | 134/6 |

OTHER PUBLICATIONS

Handbook of Semiconductor wafer Cleaning Technology, Noyes Pyblications, pp. 48–67 and 134–151, 1993.
Eitoku, Post–CMP Cleaning, Semicon Korea 95, pp. 29–36, Jan. 1995.

Primary Examiner—Jill Warden
Assistant Examiner—Alexander Markoff
Attorney, Agent, or Firm—Blakely Sokoloff Taylor & Zafman, LLP

[57] ABSTRACT

A cleaning method and apparatus using very dilute Standard Clean 1 (SC1) for cleaning semiconductor substrates, including silicon wafers. The SC1 is delivered to the core of a brush where the solution is absorbed by the brush and then applied by the brush onto the substrate. This delivery system applies the chemical solutions uniformly to the semiconductor substrate and reduces the volumes of chemical solutions used in a scrubbing process. The process of the present invention uses SC1 to convert substrate surfaces from a hydrophobic state to a hydrophilic surface state while cleaning the wafer with the brush. A hydrophilic surface state is necessary to successfully remove surface contaminants by chemical mechanical brush cleaning.

11 Claims, 3 Drawing Sheets

METHOD AND APPARATUS FOR CLEANING OF SEMICONDUCTOR SUBSTRATES USING STANDARD CLEAN 1 (SC1)

This is a continuation-in-part of U.S. patent application Ser. No. 08/542,531, filed Oct. 13, 1995, now abandoned, entitled "Method and Apparatus for Chemical Delivery Through the Brush", and assigned to the corporate assignee of the present invention.

BACKGROUND OF THE INVENTION

1. Field of the Invention

This invention relates to methods of processing a substrate, and more specifically, to a chemical mechanical scrubbing process using Standard Clean 1 (SC1) for cleaning, for example, semiconductor wafers, including bare silicon wafers and processed and partially processed semiconductor substrates.

2. Background Information

In the manufacture of semiconductor devices, the surface of semiconductor wafers must be cleaned of wafer contaminants. If not removed, wafer contaminants may affect device performance characteristics and may cause device failure to occur at faster rates than usual.

A scrubber that scrubs a wafer on either one or both sides may be used to remove wafer contaminants. The type of cleaning solution (solution) used in the scrubber may depend upon the type of contaminants to be removed, the particular type of wafer to be scrubbed, and/or the particular manufacturer's preferred method for cleaning. For example, some manufacturers require a low level of contamination and may use a chemical solution for scrubbing, while other manufacturers have a higher contamination tolerance (i.e. less contamination need be removed) and may use only water for scrubbing.

Double sided scrubbers that use soft sponge like (e.g., PVA) brushes to simultaneously clean both sides of the wafer are widely used for post CMP (chemical mechanical planarization) cleaning, cleaning of silicon wafers and general fab cleaning. The effectiveness of scrubbing wafers with soft brushes to remove surface defects has been demonstrated in both research and production. The best cleaning performance is achieved when the surface state of the incoming wafer is hydrophilic. The wafer must be uniformly wetted with water while being scrubbed by the brush. The particles which are being dislodged from the wafer surface by the brush then become suspended in the film of water which covers the wafer surface. This particle-laden film is then displaced with freshly delivered, clean DI water. In this way, the particles are removed from the wafer.

If the surface of the wafer (or isolated areas on the wafer surface) is hydrophobic and, therefore, can not be uniformly wetted, the particles will remain adhered to the surface of the wafer. Particles will also deposit onto the hydrophobic wafer surface from the PVA brush. Therefore, it is required, for successful removal of surface contaminants by brush scrubbing, that the surface of the wafer is hydrophilic. This is the case for three widely employed CMP applications: CMP of interlevel dielectric, pre-metal dielectric and Tungsten (W) CMP for the definition of the interconnect structure. In these applications, the surfaces of the wafers after polishing are hydrophilic.

In the case of CMP of prime silicon or polysilicon, the surface after polishing may be hydrophobic. (A hydrophobic surface state is also characteristic of thermally grown silicon dioxide, as grown epitaxial silicon and prime silicon which has been stripped of its native or passivating oxide.) In these cases, the surface must be converted from hydrophobic to hydrophilic for successful removal of surface contaminants by brush scrubbing. One way to perform this conversion is to use SC1 chemistry.

Standard Clean 1 (SC1) is a well-known chemical combination that is used to clean bare silicon or a silicon wafer with thermally grown or deposited oxide. SC1 consists of ammonium hydroxide ($NH_4OH$), peroxide ($H_2O_2$) and water ($H_2O$). An SC1 cleaning cycle is designed to promote oxidation and dissolution of organic impurities on the substrates in the solution of $NH_4OH$, $H_2O_2$ and $H_2O$ at a temperature of approximately 75° C. to 80° C. For one description of SC1 chemical cleaning, see W. Kern, "Hydrogen Peroxide Solutions for Silicon Wafer Cleaning," RCA Engineer, vol. 28–343, July/August 1983, pgs. 99–105.

Typically, to convert a hydrophobic surface of silicon or polysilicon to a hydrophilic surface, the substrates are dunked into a bath, separate from the scrubber, and then withdrawn from the bath and placed into a scrubber for cleaning. Thus, a separate piece of equipment is required for the conversion. What is desired is a way to allow substrates to go directly to the scrubber without having to use a separate piece of equipment such as a wet bath. A wet bath typically uses large volumes of water and chemicals and may become contaminated with repeated exposure to "dirty" wafers. It is also more difficult to control the chemical reaction at the wafer surface in a bath containing 50–100 wafers than in a single wafer system with the ability to deliver small amounts of fresh chemicals to each and every wafer.

The present invention provides for converting the surface of a semiconductor substrate in situ using an SC1 chemistry in a scrubber in such a way as to be compatible with the PVA brush material. The present invention provides for changing the surface state at the same time as mechanical brush cleaning. In this way, the use of additional equipment to convert the substrate surface from hydrophobic to hydrophilic is not necessary.

SUMMARY OF THE INVENTION

A method and apparatus for cleaning semiconductor substrates is described. The present invention includes a method and apparatus for delivering a Standard Clean 1 (SC1) solution to a core of a brush in a semiconductor substrate scrubber. The present invention also includes a method and apparatus for applying the SC1 solution to the substrate through the brush and for chemical mechanical scrubbing the substrate with the brush so as to convert a hydrophobic surface (or hydrophobic areas of a wafer surface) of a semiconductor substrate to a hydrophilic surface while cleaning the substrate with the brush.

Additional features and benefits of the present invention will become apparent from the detailed description, figures, and claims set forth below.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A method and apparatus for cleaning silicon wafers and semiconductor wafers using an SC1-based chemical mechanical scrubbing process is disclosed. The present invention may be used for surface preparation of semiconductor substrates after CMP where a conversion of a surface (or portion thereof) from hydrophobic to hydrophilic is beneficial or necessary. This area of application includes, but is not limited to, pre-gate and pre-diffusion cleaning and CMP cleaning in the front-end for the formation of poly-silicon gates, post shallow trench isolation and for similar applications. The present invention may also be used in cleaning of silicon substrates, including the final cleaning of prime silicon wafers, epitaxial silicon wafers and reclaimed silicon wafers (and any silicon substrates whose native or passivating oxide has been removed rendering the surface state hydrophobic) and the post-polish cleaning of prime silicon, epitaxial silicon and reclaimed silicon wafers by silicon wafer manufacturers.

In the following description, numerous specific details are set forth such as specific materials, process steps, process parameters, solutions, etc. in order to provide a thorough understanding of the present invention. It will be apparent, however, to one skilled in the art that these specific details need not be employed to practice the present invention. In other instances, well known materials or methods have not been described in detail in order to avoid obscuring the present invention.

Overview of the Present Invention

The present invention provides a cleaning process that uses Standard Clean 1 (SC1) to perform an in-situ conversion of a semiconductor substrate surface from a hydrophobic state to a hydrophilic state while scrubbing the substrate. In this manner, the two operations of surface state conversion and cleaning may be combined into the same system.

The present invention provides a cleaning process that applies SC1 directly to the PVA brushes of a scrubber during the scrubbing cycle. In using SC1 in the scrubber, as opposed to a wet bath, the present invention takes into account the mechanical motion of the scrubber, the speed at which the SC1 reaches the surface of the brush and at which the SC1 may be taken away from the brush, as well as the compatibility of the PVA brush material with the SC1 solution.

In one embodiment, the process is incorporated into a scrubber that scrubs both sides of a wafer simultaneously. One such system is an OnTrak Synergy™ brush-scrubbing tool or an OnTrak DSS-200 brush scrubbing tool. The combination of mechanical double sided scrubbing with in-situ surface conversion also provides an attractive alternative to multiple step processes involving more than one cleaning tool, without compromising the wafer throughput of the brush scrubber.

Figure 1:
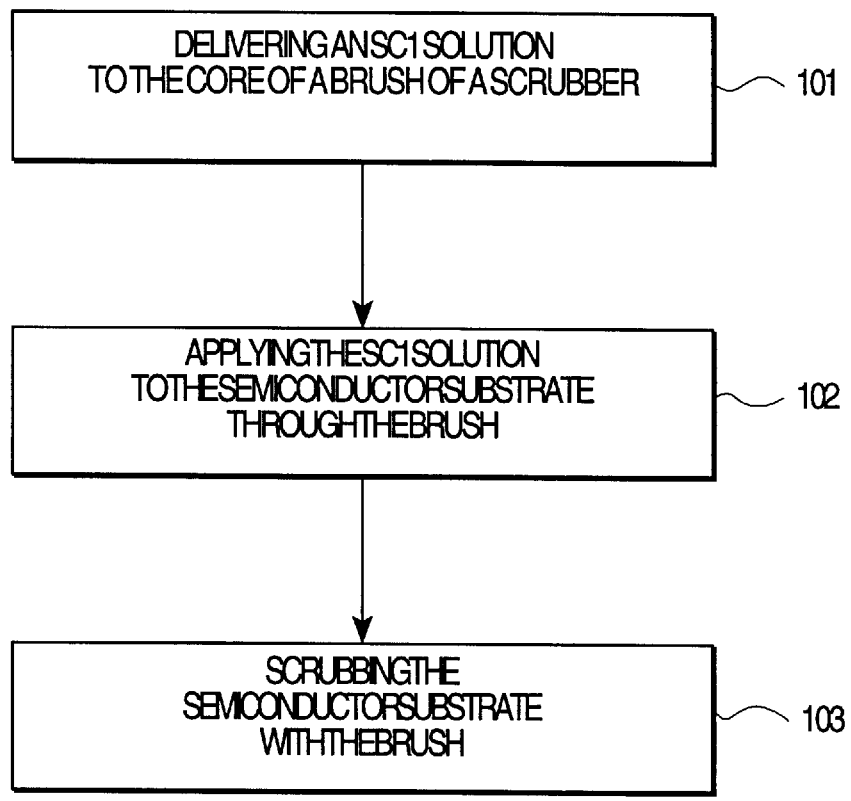
FIG. 1 is a flowchart of one embodiment of the process of the present invention.

FIG. 1 illustrates one embodiment of the process for cleaning a silicon wafer and/or semiconductor substrate in the present invention. Referring to FIG. 1, the cleaning process comprises delivering a Standard Clean 1 (SC1) solution to a core of a brush in a semiconductor substrate scrubber (processing block 101). In one embodiment, the brush comprises a PVA brush.

After delivering the SC1 solution to the brush core, the SC1 solution is applied to the substrate uniformly through the brush (processing block 102). Chemical mechanical scrubbing of the substrate with the brush follows (processing block 103). Note that the application of the solution and the scrubbing of the substrate with the brush may occur at the same time.

In one embodiment, the SC1 solution is approximately one part ammonium hydroxide ($NH_4OH$), four parts peroxide ($H_2O_2$) and twenty part water ($H_2O$), by volume. The concentration of the components in the SC1 solution may be varied depending upon the specific application.

In the present invention, the SC1 solution is applied for a predetermined amount of time. The amount of time the SC1 scrubbing process is applied can be adjusted. For instance, the SC1 solution may be dispensed through the brush for a variable length of time, such as dispense times of, for example, 20, 30, 35 and 40 seconds.

Thus, the present invention provides a new chemical mechanical process incorporating in-situ hydrophobic-to-hydrophilic surface conversion of a substrate with double sided scrubbing. The use of the two-sided scrubber allows the conversion process to be applied to one or both sides of a substrate.

It should be noted that the present invention may be employed in a number of substrate cleaning procedures. Although the present invention is described in conjunction with the scrubbing of a wafer, it will be appreciated that any similarly shaped, i.e. generally flat substrate, may be processed by the methods and apparatus of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) device, or substrates for processing other apparati and devices such as flat panel displays, multichip modules, etc. However, to avoid obscuring the invention the following description will describe wafer cleaning in general and as an example of one embodiment will describe the use of the present invention in a scrubbing process.

Overview of the Scrubbing Process

As an example, and not by limitation, the present invention is described in conjunction with a scrubbing process, more specifically, a scrubbing process in which both sides of the wafer are scrubbed. The scrubber includes a number of stations. Each of these stations represents one or more steps in the substrate cleaning process. Contaminated substrates are loaded at one end of the system and cleaned and dried substrates are unloaded from the other end of the system. An example of a system of this type is the Synergy™ scrubber or the DSS-200 system, both available from OnTrak Systems, Inc. of Milpitas, Calif.

Figure 2:
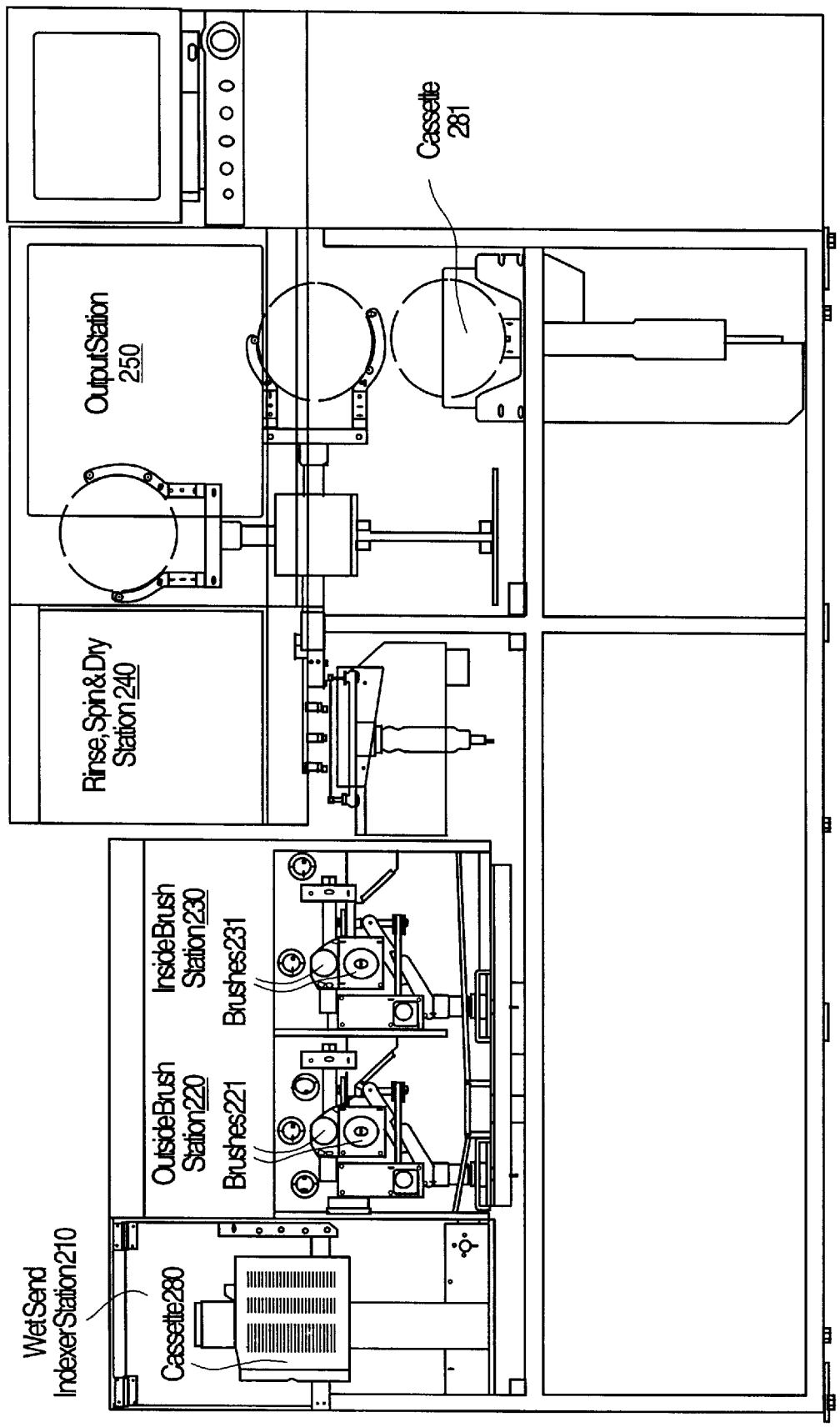
FIG. 2 represents a cross sectional view of a one embodiment of a scrubber system.

FIG. 2 represents a cross sectional view of a Synergy™ configuration (cleaning system). Usually, the contaminated substrates are delivered to the cleaning system after chemical mechanical planarization (CMP), from a wet bench, or from other processes resulting in contamination. At the start of the cleaning process contaminated substrates are loaded into a wafer cassette 280 (cassette) and the cassette 280 is then placed into the wet send indexer station 210. After cassette 280 is placed into wet send indexer station 210 the substrates are automatically removed from the cassette 280 and placed, one at a time, into the outside brush station 220.

In the outside brush station 220, a substrate is processed through a first scrub. In one embodiment, the substate is treated with the SC1 solution of the present invention during the first scrub. The SC1 solution is applied to the substrate through brushes 221.

The substrate is rinsed before being sent into the next brush station if a different chemistry is to be used in that brush station. The rinsing of the substrate occurs for about 10 to 20 seconds. If DI water or an SC1 chemistry are being used in the next brush station, the rinsing may not have to be performed.

The scrubbed substrate is then automatically removed from the outside brush station 220 and placed into the inside brush station 230. In the inside brush station 230, the substrate is processed through a second scrub. In one embodiment, the substrate is treated with another SC1 solution, an ammonium hydroxide ($NH_4OH$) solution, a hydrochloric acid solution (HCL), a hydrofluoric acid (HF), or simply DI water during the second scrub. As in the first scrub step, this solution is applied to the substrate through brushes 231. Delivery of the chemical solution through the brushes is also discussed in detail below, following the overview of the scrub process.

After the second scrub the substrate is then automatically removed from the inside brush station 230 and placed into the rinse, spin and dry station 240. Rinse, spin, and dry station 240 rinses, spins, and dries the substrate. At this point the wafer has been cleaned.

Once the rinse, spin, and dry steps have been completed the substrate is then transported from the rinse, spin, and dry station 240 to the output station 250 where the substrate will be placed into cassette 281. The transfer is usually carried out by a robotic arm which lifts the substrate out of the rinse, spin, and dry station 240 by its edges and places it into the cassette 281. The cassette is then transferred to storage or to another cleaning or processing system.

It will be clear to one of ordinary skill in the art that some of the steps in the cleaning system described above may occur in another order or with different solutions other than as presented. For example, different solutions, such as water, citric acid, ammonium hydroxide, and ammonium citrate, hydrochloric acid, hydrofluoric acid, or TMAH may be used (alone or in combination) in one of the brush stations.

It should be noted that while the following description illustrates the use of the present invention in a cleaning system in which both sides of the substrate are scrubbed, the present invention may be used in other cleaning systems and processes. For example, a cleaning system in which only a single side of the substrate is scrubbed.

Chemical Solution Delivery System

As referred to above in the discussion of the brush stations, a chemical delivery system that applies the chemical solution to the substrate through the brushes may be employed. The particular delivery system used may depend upon what chemical solution is being used and the desired concentration of the solution. In the following, a system is described designed for delivering an SC1 solution to the brush. Note that the chemical delivery system of the present invention may be designed for a variety of concentration levels.

Figure 3:
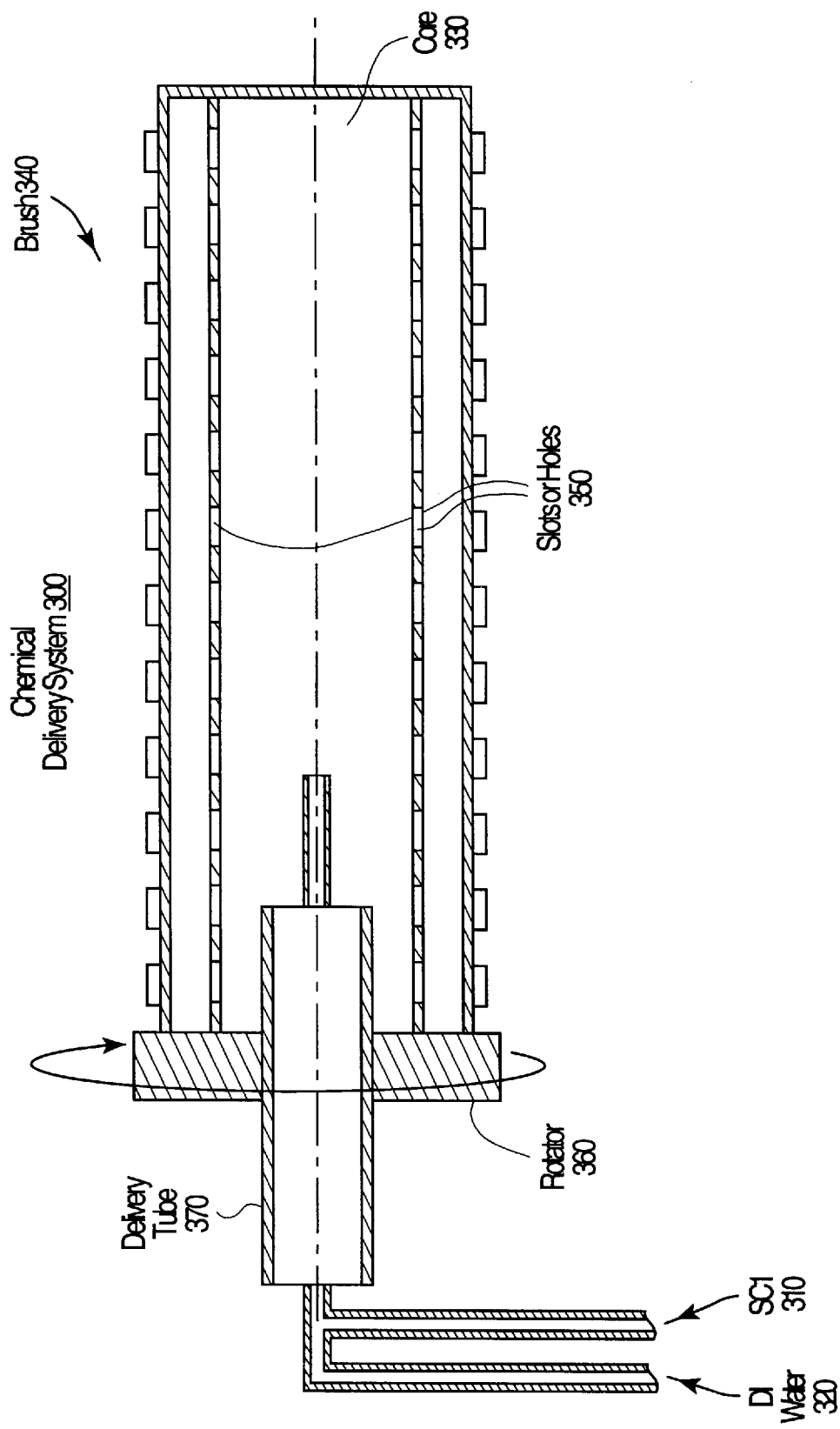
FIG. 3 illustrates one embodiment of a low concentration SC1 chemical delivery system.

One embodiment of a low concentration chemical delivery system is illustrated in FIG. 3. As an example, the chemical delivery system is described below in conjunction with the delivery of SC1.

In one embodiment of the chemical delivery system 300, the premixed SC1 solution and water are sequentially supplied through supply lines 310 and 320, respectively. Also in one embodiment, supply line 320 supplies the necessary amounts of water, for example deionized water, to the brush in order to keep the brush and substrate moist during the scrubbing process. When it is desired to perform the hydrophobic-to-hydrophilic conversion process, supply line 320, which delivers water, is turned off and supply line 310, which delivers the SC1 solution, is turned on. After a predetermined amount of time or after conversion has been performed, SC1 supply line 310 is turned off and water supply line 320 is turned back on. It may or may not be necessary to implement the water supply in between SC1 process cycles (1 wafer=1 cycle).

Supply lines 310 and 320 run into delivery tube 370. Delivery tube 370 then delivers the SC1 solution or the deionized water into hollow core 330 of brush 340 at a predetermined flow rate. In one embodiment, the flow rate for SC1 may be in the range of approximately 0.2 to approximately 0.7 liters per minute and the flow rate for deionized water may be in the range of approximately 0.5 to approximately 1 liter per minute. It will be apparent to one with ordinary skill in the art that other arrangements may be used to supply the SC1 solution and deionized water, provided the specific flow rates for each chemical or solution are set appropriately, etc.

In one embodiment of the present invention, PVA sponge brushes are used. The chemical solution (SC1 solution) is distributed to the brushes such that the brushes are evenly soaked (or saturated) with the SC1 solution. In one embodiment illustrated in FIG. 3, the brushes are saturated with the SC1 solution by absorbing the solution through the slots (or holes) 350 in the outer rim of hollow core 330. It will be apparent to one with ordinary skill in the art that other implementations and devices may be used to evenly soak the brushes, for example, baffles or channels may be used.

As brush 340 is being saturated with the SC1 solution, it is rotated by rotation device 360. Rotation device 360 turns brush 340 in a clockwise (or counterclockwise) manner, thereby applying the SC1 solution to the substrate. Because brush 340 is saturated with the SC1 solution, the solution is uniformly applied to the substrate.

The SC1 solution is only applied until the conversion is completed or for a predetermined period of time. To stop the chemical supply, SC1 supply line 310 is turned off and water supply line 320 is turned back on. After supply line 310 is turned off, the brush and substrate are rinsed with only deionized water.

It should be noted and it will be apparent to one with ordinary skill in the art that other methods for rinsing the brush and substrate, for example spraying with deionized water, are also available. Additionally, it will be apparent to one with ordinary skill in the art that the delivery system may be used in either brush station one or brush station two or the same delivery system may be used in both brush stations.

The above described chemical delivery system (i.e. chemical delivery through the brush) applies chemical solutions in a uniform manner to the semiconductor substrate and reduce the volumes of chemical solutions used in a scrubbing process.

Although specific embodiments, including specific equipment, process steps, process parameters, materials, solutions, and etc. have been described, various modifications to the disclosed embodiments will be apparent to one of ordinary skill in the art upon reading this disclosure. Therefore, it is to be understood that such embodiments are merely illustrative of and not restrictive of the broad invention and that this invention is not limited to the specific embodiments shown and described.

Thus, a method and apparatus for the cleaning of silicon wafers and semiconductor substrates with SC-1 solution has been described.

What is claimed is:

1. A method of cleaning a semiconductor substrate comprising:

turning off a first supply line which supplies water to a core of a brush in a semiconductor substrate scrubber;

turning on a second supply line to supply a Standard Clean 1 (SC1) solution to the core;

delivering the SC1 solution to the core at a predetermined flow rate;

applying the SC1 solution to the exterior of the brush through the interior of the brush from the core by absorbing the SC1 solution through openings in an outer rim of the core;

chemical mechanical scrubbing the substrate with the brush in the presence of the SC1 solution while converting a surface of the substrate from a hydrophobic state to a hydrophilic state;

turning off the second supply line; and turning on the first supply line, such that the SC1 solution and water are sequentially supplied to the core of the brush.

2. The method defined in claim 1 wherein the brush comprises a PVA brush.

3. The method defined in claim 1 wherein the SC1 solution is approximately one part ammonium hydroxide ($NH_4OH$), four parts peroxide ($H_2O_2$), and twenty parts water ($H_2O$) by volume.

4. The method defined in claim 1 wherein the predetermined flow rate ranges from 0.2 and 0.7 liters per minute.

5. The method defined in claim 1 further comprising a step of rinsing the brush scrubbing the semiconductor substrate.

6. The method defined in claim 1 comprising turning off the second supply line once the surface of the substrate has been converted from the hydrophobic state to the hydrophilic state.

7. A method for converting a hydrophobic surface to a hydrophilic surface while chemical mechanical scrubbing, said method comprising:

receiving a semiconductor substrate in a chemical mechanical scrubber; and performing a scrubbing cycle in a brush station comprising:

turning off a first supply line which supplies water to a core of a brush in a semiconductor substrate scrubber;

turning on a second supply line to supply a Standard Clean 1 (SC1) solution to the core;

delivering the SC1 solution to the core at a predetermined flow rate;

applying the SC1 solution to the exterior of the brush through the interior of the brush from the core by absorbing the SC1 solution through openings in an outer rim of the core;

scrubbing the semiconductor substrate to convert a surface of the semiconductor substrate from a hydrophobic state to a hydrophilic state while cleaning the semiconductor substrate with the brush;

turning off the second supply line; and turning on the first supply line, such that the SC1 solution and water are sequentially supplied to the core of the brush.

8. The method defined in claim 7 wherein the SC1 solution is approximately one part ammonium hydroxide ($NH_4OH$), four parts peroxide ($H_2O_2$), and twenty parts water ($H_2O$) by volume.

9. The method defined in claim 7 wherein the brush comprises a PVA brush.

10. The method defined in claim 7 wherein the predetermined flow rate ranges from 0.2 to 0.7 liters per minute.

11. The method defined in claim 7 comprising turning off the second supply line once the surface of the substrate has been converted from the hydrophobic state to the hydrophilic state.

* * * * *